(12) United States Patent
Davidson (10) Patent No.: US 10,177,643 B2
(45) Date of Patent: Jan. 8, 2019

(54) SEMICONDUCTOR SWITCHING CIRCUIT

(71) Applicant: General Electric Technology GmbH, Baden (CH)

(72) Inventor: Colin Charnock Davidson, Stafford (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 0 days.

(21) Appl. No.: 15/532,511

(22) PCT Filed: Dec. 3, 2015

(86) PCT No.: PCT/EP2015/078498
§ 371 (c)(1),
(2) Date: Jun. 2, 2017

(87) PCT Pub. No.: WO2016/087576
PCT Pub. Date: Jun. 9, 2016

(65) Prior Publication Data
US 2017/0346384 A1    Nov. 30, 2017

(30) Foreign Application Priority Data
Dec. 3, 2014    (EP) .................................... 14275251

(51) Int. Cl.
*H03K 17/72* (2006.01)
*H02M 1/08* (2006.01)
(Continued)

(52) U.S. Cl.
CPC ............... *H02M 1/08* (2013.01); *H02M 1/34* (2013.01); *H02M 5/45* (2013.01);
(Continued)

(58) Field of Classification Search
CPC .................................. H02M 1/08; H02M 5/45
(Continued)

(56) References Cited

U.S. PATENT DOCUMENTS

2009/0085656 A1* 4/2009 Havanur .......... H03K 17/08142
327/581
2012/0242391 A1* 9/2012 Fan .......................... H03K 5/08
327/330
(Continued)

FOREIGN PATENT DOCUMENTS

EP    0 967 721 A2    12/1999
EP    2 490 334 A2    8/2012
WO    0967721 A2 *  12/1999  ....... H03K 17/08148

OTHER PUBLICATIONS

Etended European Search Report and Opinion issued in connection with corresponding EP Application No. 14275251.8 dated May 20, 2015.
(Continued)

*Primary Examiner* — Ryan Jager
(74) *Attorney, Agent, or Firm* — GE Global Patent Operation; Scott R. Stanley (57) ABSTRACT

A semiconductor switching circuit, for use in a HVDC power converter, comprising: a main semiconductor switching element, including first and second connection terminals between which current flows from the first connection terminal to the second connection terminal and an auxiliary semiconductor switching element electrically connected between the first and second connection terminals thereof, and a control unit, operatively connected to auxiliary semiconductor switching element and programmed to control the switching element to create an alternative current path between the first and second connection terminals by at least two of: a fully-on mode in which the switching element is operated at its maximum rated base current or gate voltage; a pulsed switched mode in which the switching element is turned on and off; and an active mode in which the switching element is operated with a continuously variable base current or gate voltage.

14 Claims, 2 Drawing Sheets

(51) Int. Cl.
  *H02M 1/34* (2007.01)
  *H03K 17/0814* (2006.01)
  *H03K 17/10* (2006.01)
  *H02M 5/45* (2006.01)
  *H02M 1/088* (2006.01)
  *H02M 1/00* (2006.01)

(52) U.S. Cl.
  CPC ..... *H03K 17/08144* (2013.01); *H03K 17/105* (2013.01); *H02M 1/088* (2013.01); *H02M 2001/0054* (2013.01); *H02M 2001/344* (2013.01)

(58) Field of Classification Search
  USPC .......................................................... 327/447
  See application file for complete search history.

(56) References Cited

U.S. PATENT DOCUMENTS

2013/0049654 A1\* 2/2013 Kure ........................ B60L 3/003
  318/400.2
2014/0252494 A1\* 9/2014 Lui ..................... H01L 27/0629
  257/379

OTHER PUBLICATIONS

International Search Report and Written Opinion issued in connection with corresponding PCT Application No. PCT/EP2015/078498 dated Feb. 4, 2016.
International Preliminary Report on Patentability issued in connection with corresponding PCT Application No. PCT/EP2015/078498 dated Jun. 15, 2017.

\* cited by examiner

SEMICONDUCTOR SWITCHING CIRCUIT

BACKGROUND TO THE INVENTION

This invention relates to a semiconductor switching circuit for use in a high voltage direct current (HVDC) power converter.

In power transmission networks alternating current (AC) power is typically converted to direct current (DC) power for transmission via overhead lines and/or under-sea cables. This conversion removes the need to compensate for the AC capacitive load effects imposed by the transmission line or cable and reduces the cost per kilometer of the lines and/or cables, and thus becomes cost-effective when power needs to be transmitted over a long distance.

HVDC power converters are used to convert AC power to DC power. Semiconductor switching elements, such as thyristors, are a key component of HVDC power converters, and act as controlled rectifiers to convert AC power to DC power and vice versa.

While such semiconductor switching elements have very high breakdown voltages and are capable of carrying high current loads, even semiconductor switching elements from the same batch exhibit different performance characteristics. This creates difficulties in the operation of, e.g. a HVDC power converter in which the semiconductor switching elements are incorporated.

In addition, many semiconductor switching elements have inherent limitations in their performance which require the inclusion of large, heavy and difficult-to-design remedial components within, e.g. a HVDC power converter, to compensate for these shortcomings.

BRIEF DESCRIPTION

According to a first aspect of the invention, there is provided a semiconductor switching circuit, for use in a HVDC power converter.

An embodiment provides a main semiconductor switching element including first and second connection terminals between which current flows from the first connection terminal to the second connection terminal when the main semiconductor switching element is switched on, the main semiconductor switching element having an auxiliary semiconductor switching element electrically connected between the first and second connection terminals thereof.

An embodiment provides a control unit operatively connected with the auxiliary semiconductor switching element, the control unit being programmed to control switching of the auxiliary semiconductor switching element in a given operating cycle to selectively create an alternative current path between the first and second connection terminals associated therewith whereby current is diverted to flow through the alternative current path to reduce the voltage across the main semiconductor switching element.

In an embodiment, the switching of the auxiliary semiconductor switching element in a given operating cycle to create the alternative current path includes operation of the auxiliary semiconductor switching element in two or more of: a fully-on mode in which the auxiliary semiconductor switching element is operated with its maximum rated base current or gate voltage, a pulsed switched mode in which the auxiliary semiconductor switching element is turned on and off, and an active mode in which the auxiliary semiconductor switching element is operated with a continuously variable base current or gate voltage.

The switching of the auxiliary semiconductor switching element in a given operating cycle to create the alternative current path allows the voltage across the main semiconductor switching element to be controlled to a desired level, thus overcoming the difficulty faced in compensating for a variation in performance characteristics of the main semiconductor switching element.

Operation of the auxiliary semiconductor switching element in the fully-on mode may be carried out for the highest amount of current required to flow in the alternative current path.

Operation of the auxiliary semiconductor switching element in the pulsed switched mode may be carried out at intermediate values of the current required to flow in the alternative current path. The auxiliary semiconductor switching element in the pulsed switched mode may be turned on and off a plurality of times in a given operating cycle. Turning the auxiliary semiconductor switching element on and off a plurality of times within a given operating cycle helps to ensure that the level of current flowing through the alternative current path, and hence the level of current flowing through the auxiliary semiconductor switching element, remains at a level required to compensate for the aforementioned variation in performance characteristics of the main semiconductor switching element.

Operation of the auxiliary semiconductor switching element in the active mode may be carried out for low values of the current required to flow in the alternative current path and/or when fine control of the voltage across the main semiconductor switching element is required. Moreover, operation of the auxiliary semiconductor switching element in the active mode may include operation of the auxiliary semiconductor switching element in its linear region and/or saturation region.

Operation of the auxiliary semiconductor switching element in at least two of the fully-on mode, the pulsed switched mode and the active mode during switching of the auxiliary semiconductor switching element in a given operating cycle to create the alternative current path not only provides accurate control over the current flowing in the alternative current path (and therefore over the reduction across the main semiconductor switching element), but also permits optimisation of the switching of the auxiliary semiconductor switching element to control, and minimise, power dissipation in the auxiliary semiconductor switching element during the creation of the alternative current path.

The operation of the auxiliary semiconductor switching element in at least two of the fully-on mode, the pulsed switched mode and the active mode may be tailored to achieve a desired value of current flowing in the alternative current path and/or a desired level of power dissipation in the auxiliary semiconductor switching element, some examples of which are set out as follows.

In one such example, the switching of the auxiliary semiconductor switching element in a given operating cycle to create the alternative current path may include operation of the auxiliary semiconductor switching element in the fully-on mode followed by the pulsed switched mode and/or in the fully-on mode followed by the active mode and/or in the pulsed switched mode followed by the active mode.

In another such example, the switching of the auxiliary semiconductor switching element in a given operating cycle to create the alternative current path may include operation of the auxiliary semiconductor switching element in the fully-on mode, the pulsed switched mode and the active mode.

In a further such example, the switching of the auxiliary semiconductor switching element in a given operating cycle to create the alternative current path may include operation of the auxiliary semiconductor switching element in the pulsed switched and active modes such that the auxiliary semiconductor switching element is operated in the active mode during a transition period between turned-on and turned-off states of the auxiliary semiconductor switching element.

Combining the pulsed switch and active modes in this manner eliminates the problems normally associated with voltage step changes being imposed across the main semiconductor switching element whilst continuing to provide the desired control over the level of current flowing through the alternative current path.

Typically, the highest current is required to flow in the alternative current path immediately after turn-off of the main semiconductor switching element, i.e. during the commutation overshoot transient. Accordingly, the switching of the auxiliary semiconductor switching element in a given operating cycle to create the alternative current path may include operation of the auxiliary semiconductor switching element in the fully-on mode during a commutation overshoot transient of the main semiconductor switching element.

The auxiliary semiconductor switching element may be or may include a transistor having an emitter or source connected to the first connection terminal of the main semiconductor switching element, a collector or drain connected to the second connection terminal of the corresponding main semiconductor switching element, and a base or gate connected to the control unit.

A transistor, especially one incorporating a wide-bandgap semiconducting material such as silicon carbide, gallium nitride or diamond, has the required high voltage performance characteristic necessary to match or even exceed that of the main semiconductor switching element, while at the same time permitting the passage therethrough of a relatively small amount of current necessary to effect the desired reduction in voltage across the main semiconductor switching element.

According to a second aspect of the invention, there is provided a semiconductor switching string, for use in a HVDC power converter, comprising a plurality of series-connected semiconductor switching assemblies, at least one of the semiconductor switching assemblies including a semiconductor switching circuit according to any embodiment of the first aspect of the invention.

The inclusion of a control unit which is programmed to switch on a respective auxiliary semiconductor switching element to selectively create an alternative current path between the first and second connection terminals of a corresponding main semiconductor switching element, whereby current is diverted through the alternative current path to reduce the voltage across the corresponding main semiconductor switching element, allows the semiconductor switching string to compensate for a variation in the turn-off performance characteristic of the various main semiconductor switching elements in the string of series-connected main semiconductor switching elements. As such the semiconductor switching string permits the mix and match of semiconductor switching elements, e.g. thyristors, from not just different batches but from different suppliers. Furthermore, the switching string drastically reduces the size of an associated remedial component, e.g. a damping circuit that is otherwise required to compensate for the aforementioned variation in the turn-off performance characteristic of a series of semiconductor switching elements.

The switching of the or each auxiliary semiconductor switching element in a given operating cycle to create the alternative current path may include operation of the or each auxiliary semiconductor switching element in the pulsed switched mode to compensate for a variation in reverse recovered charges of two or more of the main semiconductor switching elements.

The switching of the or each auxiliary semiconductor switching element in a given operating cycle to create the alternative current path may include operation of the or each auxiliary semiconductor switching element in the active mode after the or each auxiliary semiconductor switching element is operated in the pulsed switched mode to compensate for a variation in reverse recovered charges of two or more of the main semiconductor switching elements.

The switching of the or each auxiliary semiconductor switching element in a given operating cycle to create the alternative current path may include operation of the or each auxiliary semiconductor switching element in the active mode to compensate for residual voltage imbalance between two or more of the main semiconductor switching elements.

The switching of the or each auxiliary semiconductor switching element in a given operating cycle to create the alternative current path may include operation of the or each auxiliary semiconductor switching element in the fully-on mode followed by the active mode to compensate for a variation in reverse recovered charges of two or more of the main semiconductor switching elements. Such operation of the or each auxiliary semiconductor switching element in the fully-on mode may be carried out during a commutation overshoot transient of the corresponding main semiconductor switching element.

As mentioned earlier, operation of a given auxiliary semiconductor switching element in at least two of the fully-on mode, the pulsed switched mode and the active mode during switching of the given auxiliary semiconductor switching element in a given operating cycle to create the alternative current path not only provides accurate control over the current flowing in the alternative current path (and therefore over the reduction across the corresponding main semiconductor switching element), but also permits optimisation of the switching of the given auxiliary semiconductor switching element to control, and minimise, power dissipation in the given auxiliary semiconductor switching element during the creation of the alternative current path.

BRIEF DESCRIPTION OF THE DRAWINGS

An embodiment of the invention will now be described, by way of a non-limiting example, with reference to the accompanying drawings in which.

DETAILED DESCRIPTION

Figure 1:
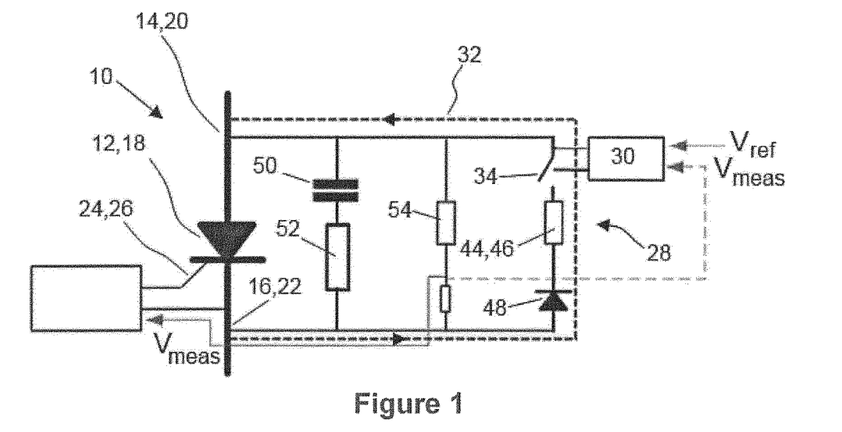
FIG. 1 shows a schematic view of a first semiconductor switching assembly which forms a part of a semiconductor switching string according to an embodiment.

The first semiconductor switching assembly 10 includes a semiconductor switching circuit with a main semiconductor switching element 12 which has first and second connection terminals 14, 16. In the embodiment shown the main semiconductor switching element 12 is a main thyristor 18, although in other embodiments a different semiconductor switching element may be used such as a diode, Light-Triggered Thyristor (LTT), Gate Turn-Off thyristor (GTO), Gate Commutated Thyristor (GCT) or Integrated Gate Commutated Thyristor (IGCT). In an embodiment, the main semiconductor switching element 12 is optimised for lowest conduction (on-state) losses at the expense of other parameters such as turn-on and turn-off characteristics and off-state dv/dt capability.

The main thyristor 18 shown includes an anode 20 which defines the first connection terminal 14, a cathode 22 which defines the second connection terminal 16, and a gate 24 that defines a control terminal 26 via which the main thyristor 18 may be switched on.

When the main thyristor 18 is so switched on, i.e. turned-on fully, current flows through the main thyristor 18 from the first connection terminal 14 to the second connection terminal 16, i.e. from the anode 20 to the cathode 22.

The main thyristor 18 has an auxiliary semiconductor switching element 28 which is electrically connected between the first and second connection terminals 14, 16 of the main thyristor 18, and the auxiliary semiconductor switching element 28 has a control unit 30 that is operatively connected therewith. The control unit 30 is programmed to switch on the auxiliary semiconductor switching element 28 to selectively create an alternative current path 32 between the first and second connection terminals 14, 16.

More particularly the auxiliary semiconductor switching element 28 is connected in inverse-parallel with the main thyristor 18 such that when the auxiliary semiconductor switching element is switched on the resulting alternative current path 32 is configured to allow current to flow from the second connection terminal 16 to the first connection terminal 14.

More particularly, still the auxiliary semiconductor switching element 28 includes a transistor 34 which has a source that is connected to the first connection terminal 14 of the main thyristor 18, a drain that is connected to the second connection terminal 16 of the main thyristor 18, and a gate that is connected to the control unit 30.

The transistor 34 shown in FIG. 1 is a metal-oxide-semiconductor field effect transistor (MOSFET), although many other transistors may also be used such as, for example, a bipolar junction transistor (BJT), an insulated gate bipolar transistor (IGBT), or a junction gate field-effect transistor (JFET). A transistor assembly, such as a MOSFET-JFET cascode circuit incorporating a super-cascode arrangement of 50V MOSFETs and a series string of 1200V SiC JFETs, or a direct series connection of low voltage MOSFETs or IGBTs, may also be used.

It will be appreciated that, depending on the type of transistor, one or more of the terms "source", "drain" and "gate" may be respectively replaced by the terms "emitter", "collector" and "base". By way of example, whilst a MOSFET and a JFET each has a source, drain and gate combination, an IGBT has an emitter, collector and gate combination while a BJT has an emitter, collector and base combination.

The auxiliary semiconductor switching element 28 shown in FIG. 1 also includes an optional current limiting element 44, in the form of a resistor 46, which is connected in series with the transistor 34 and anti-parallel diode (not shown) combination mentioned above. The auxiliary semiconductor switching element 28 also additionally includes a further, series-connected diode 48 which is arranged to permit the flow of current through the alternative current path 32 in the same direction as through the transistor 34. The further, series-connected diode 48 is included, in conjunction with the anti-parallel diode, to protect the transistor 34 from reverse voltages while the main thyristor 18 is forward-biased.

In some embodiments, in which the auxiliary semiconductor switching element 28, i.e. the transistor 34, is capable of withstanding reverse voltage (while the main semiconductor switching element 12, i.e. the main thyristor 18, is forward-biased) the anti-parallel diode and the series-connected diode 48 may be omitted.

As well as having the auxiliary semiconductor switching element 28 connected in inverse-parallel therewith, the main thyristor 18 also may have a damping circuit (which includes a damping capacitor 50 and a damping resistor 52), as well as a further resistor 54, i.e. a DC grading resistor, connected in parallel between the first and second connection terminals 14, 16.

In use an ideal thyristor would cease to conduct exactly at the instant when the current flowing through the thyristor falls to zero. However, a real thyristor, such as the main thyristor 18 shown in FIG. 1, continues to conduct current in a reverse direction (even when the main thyristor 18 is switched off and in a so-called reverse-biased condition) for some hundreds of microseconds after the current falls to zero. The time integral of this reverse current is the 'reverse recovered charge' ($Q_{rr}$), i.e. stored charge, of the main thyristor 18.

Figure 2:
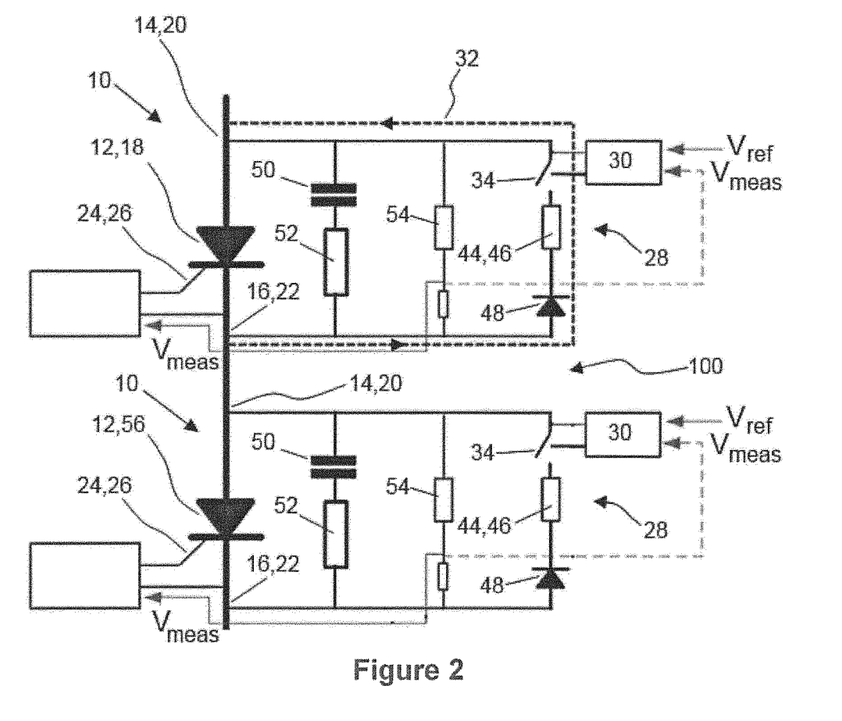
FIG. 2 shows a schematic view of two of the first semiconductor switching assemblies shown in FIG. 1 connected in series with one another to form a portion of the semiconductor switching string according to the embodiment.

In the embodiment shown, the main thyristor 18 has a lower $Q_{rr}$ than, e.g. a second main thyristor 56 in an otherwise identical further first semiconductor switching assembly 10 which is connected in series with the first semiconductor switching assembly 10 that includes the first main thyristor 18, as shown in FIG. 2.

In this way, the two first semiconductor switching assemblies 10 together define a portion of the semiconductor switching string 100 according to an embodiment, which additionally includes further series-connected first semiconductor switching assemblies (not shown). The two semiconductor switching assemblies 10 shown each has its own corresponding control unit 30. In other embodiments, however, one or more such semiconductor switching assemblies 10 within a given semiconductor switching string may share a common control unit.

Meanwhile, the aforementioned difference in $Q_{rr}$ between the first and second main thyristors 18, 56 arises because the first main thyristor 18 starts to turn off sooner than the second main thyristor 56. As a result, the reverse current flowing through the first main thyristor 18 will start to reduce sooner than in the second main thyristor 56.

When the first and second main thyristors 18, 56 are connected in the series arrangement shown in FIG. 2, i.e. as a portion of the first semiconductor switching string 100, the current flowing through the first semiconductor switching assembly 10 (i.e. the switching assembly including the first main thyristor 18) must be the same as the current flowing through the further first semiconductor switching assembly 10 (i.e. the switching assembly including the second main thyristor 56). Since the first main thyristor 18 turns off sooner (and so no longer conducts current), the difference in reverse current flows into the damping circuit, i.e. the damping capacitor 50 and the damping resistor 52, of the first main thyristor 18. This causes the voltage V across the first main thyristor 18 to build up sooner, and reach a larger reverse peak voltage, than the second main thyristor 56 with a higher $Q_{rr}$.

Such operation, if left un-checked, gives rise to a voltage offset $\Delta V$ between the voltage across the first main thyristor 18 and the voltage across the second main thyristor 56, where the voltage offset $\Delta V$ is given by:

$$\Delta V = \Delta Q_{rr}/C_d$$

Where $\Delta Q_{rr}$ is the difference in charge stored by the second main thyristor 56 and the first main thyristor 18, and $C_d$ is the value of the damping capacitor 50.

Such a voltage offset can persist for a long time such that it does not decay significantly before the first main thyristor 18 is turned on again approximately 240 electrical degrees later. Such a voltage offset can also significantly affect the timing point at which the voltage across a given main thyristor 18, 56 crosses zero. This impacts on the accuracy of an extinction angle that must be established, e.g. when the main thyristors 18, 56 form part of a HVDC power converter which is operating as an inverter and requires that the extinction angle includes a margin to accommodate such variations in stored charge.

However, in the case of the first semiconductor switching string 100, each control unit 30 is programmed to switch on the corresponding auxiliary semiconductor switching element 28, i.e. the corresponding transistor 34, while the corresponding first main thyristor 18 is in the aforementioned reverse-biased condition and while a reverse current I is flowing through the said first main thyristor 18, to create the corresponding alternative current path 32 and thereby divert the reverse current through the corresponding alternative current path 32. Such diversion of the reverse current through the corresponding alternative current path 32 prevents this current flowing into the associated damping circuit which has the effect of inhibiting the build-up of voltage across the first main thyristor 18 (and so is equivalent to reducing the effective off-state impedance of the corresponding first main thyristor 18) such that the resulting voltage across the corresponding first main thyristor 18 is reduced.

More particularly, each control unit 30 is programmed to control the amount of current directed to flow through the corresponding alternative current path 32 by switching the corresponding transistor 34 within a switching operation in which the transistor 34 operates in a fully-on mode followed by a pulsed switched mode followed by an active mode during a given operating cycle of the semiconductor switching string 100, i.e. while each main semiconductor switching element 12, i.e. the main thyristors 18, 56, is in the reverse-biased condition.

Having the control unit 30 programmed to switch on the corresponding auxiliary semiconductor switching element 28 means that the control unit 30 is able to control at will, i.e. as needed, the switching in and out of use of the corresponding auxiliary semiconductor switching element 28.

In other words, the control unit 30 can be considered as an active control unit which is itself able to actively control the switching, on and off, of a respective auxiliary semiconductor switching element 28. This is in contrast, for example, to the control of a given auxiliary semiconductor switching element 28 being handled passively by passive components, such as resistors, capacitors or Zener diodes, that are able only to react to changes in a current flowing therethrough or a voltage applied thereto, and so are unable to switch the auxiliary semiconductor switching element on and off independently of such a current or voltage, i.e. are unable to switch the auxiliary semiconductor switching element on and off at will.

Figure 3:
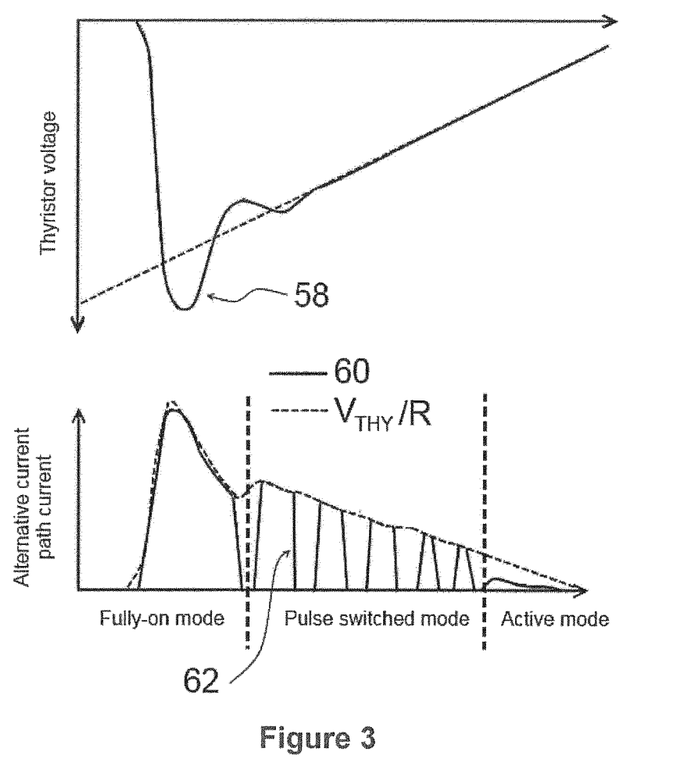
FIG. 3 illustrates a switching operation of an auxiliary semiconductor switching element of the first semiconductor switching assembly of FIG. 1.

Further details of the switching operation of the transistor 34 is described as follows, with reference to FIGS. 3 and 4.

During the commutation overshoot transient 58 of the corresponding first main thyristor 18 (i.e. when the highest amount of reverse current 60 is required to flow in the alternative current path 32), the transistor 34 is operated in the fully-on mode in which the transistor 34 is operated with its maximum rated gate voltage.

Following the operation of the transistor 34 in the fully-on mode and at intermediate values of the reverse current 60 required to flow in the alternative current path 32, the transistor 34 is operated in the pulsed switched mode in which the transistor 34 is turned on and off a plurality of times. This helps to ensure that the level of reverse current 60 flowing through the alternative current path 32, and hence the level of reverse current 60 flowing through the transistor 34, remains at a level required to compensate for the aforementioned variation in turn-off performance characteristics of the corresponding first main thyristor 18, e.g. to compensate for a variation in $Q_{rr}$ between the main thyristors 18, 56.

During the pulsed switched mode, the transistor 34 is intermittently operated in its active mode in which it is operated with a continuously variable gate voltage. More specifically, while the transistor 34 is turned on and off during the pulsed switched mode the transistor 34 is operated in the active mode during each transition period between turned-on and turned-off states of the auxiliary semiconductor switching element, whereby the reverse current 60 flowing in the alternative current path 32 ramps up or down during each transition period. Combining the pulsed switch and active modes in this manner results in a more gradual ramp 62 of the reverse current 60 in each transition period, and thereby eliminates the problems normally associated with voltage step changes being imposed across the corresponding first main thyristor 18 whilst continuing to provide the desired control over the level of reverse current 60 flowing through the alternative current path 32.

Each control unit 30 is also programmed to switch on the corresponding transistor 34 when the voltage across the corresponding first main thyristor 18 differs from a voltage reference derived from the voltage across all of the main semiconductor switching elements 12 in the string 100.

In the first embodiment of semiconductor switching string 100 the voltage reference is equivalent to the average voltage across all of the main semiconductor switching elements 12 in the string 100, i.e. the average voltage across the first and second main thyristors 18, 56 shown and all of the remaining main thyristors (not shown). Such an average voltage could be established by a high bandwidth voltage divider across series-connected first and second main thyristors 18, 56, or by having each main thyristor 18, 56 report its own voltage back to its corresponding control unit 30 (or another, overarching control system or higher level controller) and for one of the control units 30 (or the overarching control system) to compute the average voltage (and, in the case of an overarching control system, have that system re-transmit a signal representing the said computed average voltage to each of the control units 30).

By way of example, with reference to the portion of the first semiconductor switching string 100 shown in FIG. 2, the control unit 30 of the first semiconductor switching assembly 10 compares the voltage across the first main thyristor 18 with the average voltage and, when the voltage across the first main thyristor 18 is higher than the average voltage, the control unit 30 switches the transistor 34 of the inverse-parallel connected auxiliary semiconductor switching element 28 on and off in the pulsed switched mode as to selectively direct current through the alternative current path 32 and thereby selectively inhibit the build-up of voltage across the first main thyristor 18. Such switching has the effect of passing an amount of charge between the first and second terminals 14, 16 of the first main thyristor 18 which is equal to the difference in the $Q_{rr}$ of the first main thyristor 18 and the $Q_{rr}$ of the second main thyristor 56.

As indicated, this has the effect of reducing the voltage across the first main thyristor 18 while increasing the voltage across the second main thyristor 56, which was below the average voltage. This has the net effect that the voltage across each of the main thyristors 18, 56 is brought closer to the average voltage, i.e. the voltage across each of the main thyristors 18, 56 approaches the voltage reference, such that following the pulsed switched mode, the variation in the voltages across the main thyristors 18, 56 (and hence the variation in $Q_{rr}$ between the main thyristors 18, 56 arising from their differing turn-off performance characteristics) is compensated for and cancelled out.

Alternatively, the variation in $Q_{rr}$ between the main thyristors 18, 56 may be compensated for and cancelled out by switching the transistor 34 of the inverse-parallel connected auxiliary semiconductor switching element 28 in the active mode following the fully-on mode, without switching the transistor 34 of the inverse-parallel connected auxiliary semiconductor switching element 28 on and off in the pulsed switched mode.

Such compensation for the variation in $Q_{rr}$ between the main thyristors 18, 56 has the additional benefit of reducing by between 70% and 90% the required capacitance $C_d$ of the damping capacitor 50 and the power rating of the damping resistor 52.

In the foregoing manner, within the semiconductor switching string 100 of series-connected first semiconductor switching assemblies 10, each control unit 30 (or a single control unit operatively connected to the inverse-parallel connected auxiliary semiconductor switching element 28 of each main thyristor 18, if so configured) compares the voltage across its corresponding main thyristor 18 with the voltage reference.

Those main thyristors 18 whose voltage is above the voltage reference then have their inverse-parallel connected auxiliary semiconductor switching element 28 switched on and off in the pulsed switched mode by the corresponding control unit 30 to selectively divert current through the corresponding alternative current path 32 in order to reduce the voltage across each of the said above-average voltage main thyristors 18, so as to bring the voltage of these main thyristors 18 closer to the voltage reference. This has the effect of increasing the average voltage of the remaining below-average voltage main thyristors until eventually, i.e. after a number of similar switching operations, all the main thyristors, except the one with the longest turn-off time (i.e. the largest $Q_{rr}$), have compensated for their respective turn-off time discrepancies (i.e. their respective $Q_{rr}$ discrepancies).

Following the pulsed switched mode, the transistor 34 is then operated in the active mode at low values of the reverse current 60 required to flow in the alternative current path 32. This provides fine control of the voltage across the corresponding first main thyristor 18, e.g. to compensate for residual voltage imbalance between the main thyristors 18, 56 which may be caused by one or more other sources.

Figure 4:
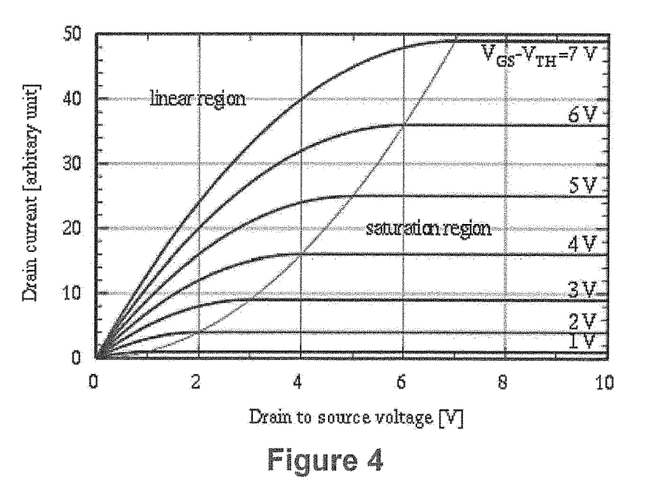
FIG. 4 illustrates the voltage-current characteristics of a MOSFET.

It will be appreciated that operation of the transistor 34 in the active mode may include operation of the transistor 34 in its linear region and/or saturation region, both of which are illustrated in FIG. 4.

Operation of the auxiliary semiconductor switching element 28 in the fully-on mode, the pulsed switched mode and the active mode during switching of the auxiliary semiconductor switching element 28 in a given operating cycle to create the alternative current path 32 not only provides accurate control over the reverse current 60 flowing in the alternative current path 32 (and therefore over the reduction across the main semiconductor switching element 12), but also permits optimisation of the switching of the auxiliary semiconductor switching element 28 to control, and minimise, power dissipation in the auxiliary semiconductor switching element 28 during the creation of the alternative current path 32.

It is envisaged that, in other embodiments of the invention, the switching operation may omit one of the fully-on mode, pulsed switched mode and active mode, that is to say the switching operation may include two of the fully-on mode, pulsed switched mode and active mode.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor switching circuit, for use in a HVDC power converter, comprising:
   a main semiconductor switching element comprising a first connection terminal second connection terminal between which current flows from the first connection terminal to the second connection terminal when the main semiconductor switching element is switched on, the main semiconductor switching element having an auxiliary semiconductor switching element electrically connected between the first and second connection terminals; and
   a control unit operatively connected with the auxiliary semiconductor switching element, the control unit being programmed to control switching of the auxiliary semiconductor switching element in an operating cycle to selectively create an alternative current path between the first and second connection terminals associated therewith wherein current is diverted to flow through the alternative current path to reduce the voltage across the main semiconductor switching element,
   wherein the switching of the auxiliary semiconductor switching element in an operating cycle to create the alternative current path comprises operation of the auxiliary semiconductor switching element in at least two of:

a fully-on mode in which the auxiliary semiconductor switching element is operated with its maximum rated base current or gate voltage;

a pulsed switched mode in which the auxiliary semiconductor switching element is turned on and off; and an active mode in which the auxiliary semiconductor switching element is operated with a continuously variable base current or gate voltage.

2. A semiconductor switching circuit according to claim 1, when the auxiliary semiconductor switching element is operated in the pulsed switched mode and at least one of the fully-on mode and the active mode, the auxiliary semiconductor switching element in the pulsed switched mode is turned on and off a plurality of times in an operating cycle.

3. A semiconductor switching circuit according to claim 1, when the auxiliary semiconductor switching element is operated in the active mode and at least one of the fully-on mode and the pulsed switched mode, of the auxiliary semiconductor switching element in the active mode is operated in its linear region and/or saturation region.

4. A semiconductor switching circuit according to claim 1, when the auxiliary semiconductor switching element is operated in the fully-on mode and the pulsed switched mode, the switching of the auxiliary semiconductor switching element in an operating cycle to create the alternative current path comprises operation of the auxiliary semiconductor switching element in the fully-on mode followed by the pulsed switched mode.

5. A semiconductor switching circuit according to claim 1, wherein the switching of the auxiliary semiconductor switching element in an operating cycle to create the alternative current path comprises operation of the auxiliary semiconductor switching element in the fully-on mode, the pulsed switched mode and the active mode.

6. A semiconductor switching circuit according to claim 1, when the auxiliary semiconductor switching element is operated in at least the pulsed switched mode and the active mode, the switching of the auxiliary semiconductor switching element in an operating cycle to create the alternative current path comprises operation of the auxiliary semiconductor switching element in the pulsed switched and active modes such that the auxiliary semiconductor switching element is operated in the active mode during a transition period between turned-on and turned-off states of the auxiliary semiconductor switching element.

7. A semiconductor switching circuit according to claim 1, when the auxiliary semiconductor switching element is operated in the fully-on mode and at least one of the pulsed switched mode and the active mode, the switching of the auxiliary semiconductor switching element in an operating cycle to create the alternative current path comprises operation of the auxiliary semiconductor switching element in the fully-on mode during a commutation overshoot transient of the main semiconductor switching element.

8. A semiconductor switching circuit according to claim 1, wherein the auxiliary semiconductor switching element comprises a transistor having an emitter or source connected to the first connection terminal of the main semiconductor switching element, a collector or drain connected to the second connection terminal of the corresponding main semiconductor switching element, and a base or gate connected to the control unit.

9. A semiconductor switching string, for use in a HVDC power converter, comprising a plurality of series-connected semiconductor switching assemblies, at least one of the semiconductor switching assemblies comprising a semiconductor switching circuit comprising:

a main semiconductor switching element comprising a first connection terminal second connection terminal between which current flows from the first connection terminal to the second connection terminal when the main semiconductor switching element is switched on, the main semiconductor switching element having an auxiliary semiconductor switching element electrically connected between the first and second connection terminals; and a control unit operatively connected with the auxiliary semiconductor switching element, the control unit being programmed to control switching of the auxiliary semiconductor switching element in an operating cycle to selectively create an alternative current path between the first and second connection terminals associated therewith wherein current is diverted to flow through the alternative current path to reduce the voltage across the main semiconductor switching element;

wherein the switching of the auxiliary semiconductor switching element in an operating cycle to create the alternative current path comprises operation of the auxiliary semiconductor switching element in at least two of:

a fully-on mode in which the auxiliary semiconductor switching element is operated with its maximum rated base current or gate voltage;

a pulsed switched mode in which the auxiliary semiconductor switching element is turned on and off; and an active mode in which the auxiliary semiconductor switching element is operated with a continuously variable base current or gate voltage.

10. A semiconductor switching string according to claim 9, when the auxiliary semiconductor switching element is operated in the pulsed switched mode and at least one of the fully-on mode and the active mode, the switching of the or each auxiliary semiconductor switching element in an operating cycle to create the alternative current path comprises operation of the or each auxiliary semiconductor switching element in the pulsed switched mode to compensate for a variation in reverse recovered charges of two or more of the main semiconductor switching elements.

11. A semiconductor switching string according to claim 9, when the auxiliary semiconductor switching element is operated in at least the pulsed switchd mode and the active mode, the switching of the or each auxiliary semiconductor switching element in an operating cycle to create the alternative current path comprises operation of the or each auxiliary semiconductor switching element in the active mode after the or each auxiliary semiconductor switching element is operated in the pulsed switched mode to compensate for a variation in reverse recovered charges of two or more of the main semiconductor switching elements.

12. A semiconductor switching string according to claim 9, when the auxiliary semiconductor switching element is operated in the active mode and at least one of the fully-on mode and the pulsed switched mode, the switching of the or each auxiliary semiconductor switching element in an operating cycle to create the alternative current path comprises operation of the or each auxiliary semiconductor switching element in the active mode to compensate for residual voltage imbalance between two or more of the main semiconductor switching elements.

13. A semiconductor switching string according to claim 9, when the auxiliary semiconductor switching element is operated in at least the fully-on mode and the active mode, the switching of the or each auxiliary semiconductor switching element in an operating cycle to create the alternative current path comprises operation of the or each auxiliary semiconductor switching element in the fully-on mode followed by the active mode to compensate for a variation in reverse recovered charges of two or more of the main semiconductor switching elements.

14. A semiconductor switching string according to claim 13, when the auxiliary semiconductor switching element is operated in the fully-on mode and at least one of the pulsed switched mode and the active mode, the operation of the or each auxiliary semiconductor switching element in the fully-on mode is carried out during a commutation overshoot transient of the corresponding main semiconductor switching element.

* * * * *